(12) United States Patent
Liao et al.

(10) Patent No.: US 9,543,141 B2
(45) Date of Patent: Jan. 10, 2017

(54) METHOD FOR CURING FLOWABLE LAYER (71) Applicant: Taiwan Semiconductor Manufacturing Co., Ltd, Hsin-Chu (TW)

(72) Inventors: Chi-Ming Liao, Hsinchu (TW); Ker-Hsun Liao, Hsinchu (TW); Chun-Ou Liu, Zhubei (TW); Su-Horng Lin, Hsinchu (TW)

(73) Assignee: TAIWAN SEMICONDUCTOR MANUFACTURING CO., LTD, Hsin-Chu (TW)

( * ) Notice: Subject to any disclaimer, the term of this patent is extended or adjusted under 35 U.S.C. 154(b) by 0 days.

(21) Appl. No.: 14/564,304

(22) Filed: Dec. 9, 2014

(65) Prior Publication Data
US 2016/0163540 A1 Jun. 9, 2016

(51) Int. Cl.
*H01L 21/02* (2006.01)
*H01L 21/3105* (2006.01)

(52) U.S. Cl.
CPC ... *H01L 21/02318* (2013.01); *H01L 21/02164* (2013.01); *H01L 21/02205* (2013.01); *H01L 21/02271* (2013.01); *H01L 21/02282* (2013.01); *H01L 21/3105* (2013.01)

(58) Field of Classification Search
CPC ........ H01L 29/06; H01L 23/535; H01L 21/02; H01L 21/00; H01L 21/3105; H01L 21/02318;H01L 21/02164; H01L 21/02205; H01L 21/02271; H01L 21/02282; H01L 21/22; H01L 21/265; H01L 21/228; H01L 21/225; H01L 21/2225; H01L 21/2255
USPC ............... 438/782, 491, 492, 495, 499, 500, 505,438/509, 493, 522, 530
See application file for complete search history.

(56) References Cited

U.S. PATENT DOCUMENTS

| | | | |
|---|---|---|---|
| 2011/0081782 A1* | 4/2011 | Liang et al. | 438/697 |
| 2011/0151677 A1* | 6/2011 | Wang et al. | 438/773 |
| 2012/0205774 A1 | 8/2012 | Wang | |
| 2014/0057409 A1 | 2/2014 | Wang | |
| 2014/0252497 A1 | 9/2014 | Peng et al. | |

* cited by examiner

*Primary Examiner* — Chuong A Luu
(74) *Attorney, Agent, or Firm* — McClure, Qualey & Rodack, LLP (57) ABSTRACT

Methods for forming a semiconductor structure are provided. The method for forming a semiconductor structure includes forming a flowable layer over a substrate and heating the flowable layer to form a cured layer in a curing process. In addition, the curing process is performed under a pressure of over 2 atmospheres, and the flowable layer reacts with precursors in the flowable layer during the curing process.

18 Claims, 9 Drawing Sheets

METHOD FOR CURING FLOWABLE LAYER

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers over a semiconductor substrate, and patterning the various material layers using lithography to form circuit components and elements.

One of the important drivers for increased performance in semiconductor devices is the higher levels of integration of circuits. This is accomplished by miniaturizing or shrinking device sizes on a given chip. Tolerance plays an important role in being able to shrink the dimensions of a chip.

However, although existing manufacturing processes for forming semiconductor devices have been generally adequate for their intended purposes, as device scaling-down continues, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of methods for forming a semiconductor structure are provided. The method may include forming a flowable layer and curing the flowable layer under a relatively high pressure. The high pressure may enable precursors being driven into the flowable layer, such that the precursor can react with the flowable layer to form a cured layer.

Figure 1:
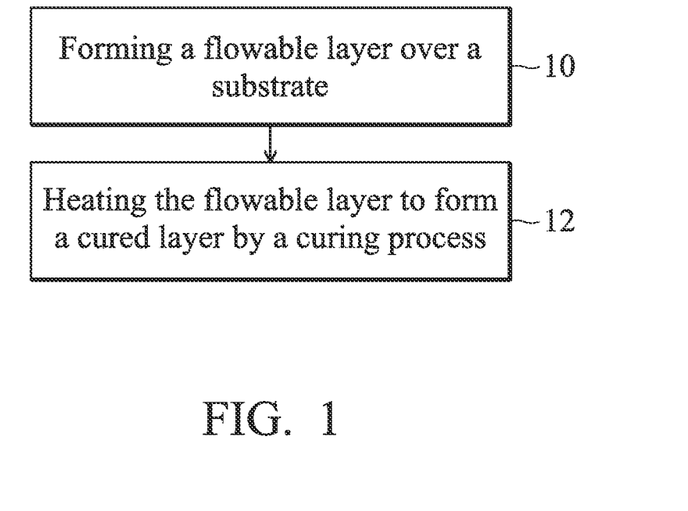
FIG. 1 is a flow chart of a method for forming a semiconductor structure in accordance with some embodiments.

FIG. 1 is a flow chart of a method for forming a semiconductor structure in accordance with some embodiments. In operation 10, a flowable layer is formed over a substrate. In operation 12, the flowable layer is heated to form a cured layer in a curing process.

Figure 2A:
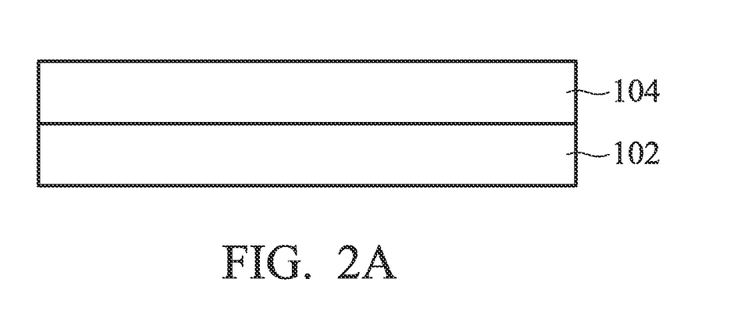
FIGS. 2A and 2B are cross-sectional representations of various stages of forming a semiconductor structure in accordance with some embodiments.
Figure 2B:
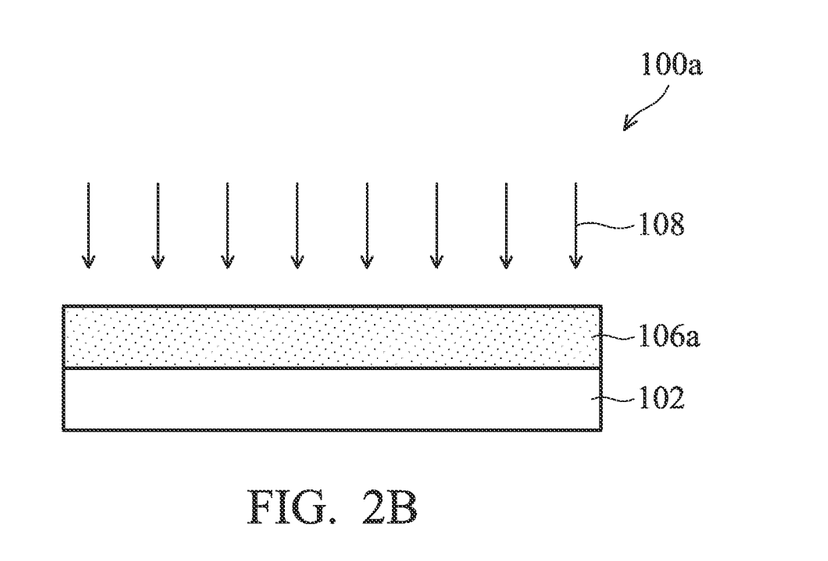

FIGS. 2A and 2B are cross-sectional representations of various stages of forming a semiconductor structure 100a in accordance with some embodiments. Semiconductor structure 100a may be formed by the method shown in FIG. 1.

As shown in FIG. 2A, a substrate 102 is provided in accordance with some embodiments. Substrate 102 may be a semiconductor wafer such as a silicon wafer. Alternatively or additionally, substrate 102 may include elementary semiconductor materials, compound semiconductor materials, and/or alloy semiconductor materials. Examples of the elementary semiconductor materials may be, but are not limited to, crystal silicon, polycrystalline silicon, amorphous silicon, germanium, and/or diamond. Examples of the compound semiconductor materials may be, but are not limited to, silicon carbide, gallium arsenic, gallium phosphide, indium phosphide, indium arsenide, and/or indium antimonide. Examples of the alloy semiconductor materials may be, but are not limited to, SiGe, GaAsP, AlInAs, AlGaAs, GaInAs, GaInP, and/or GaInAsP.

In addition, substrate 102 may include structures such as doped regions, interlayer dielectric (ILD) layers, conductive features, and/or isolation structures. Furthermore, substrate 102 may further include single or multiple material layers to be patterned. For example, the material layers may include a silicon layer, a dielectric layer, and/or a doped poly-silicon layer.

A flowable layer 104 is formed over substrate 102, as shown in operation 10 in FIG. 1 and in FIG. 2A in accordance with some embodiments. Flowable layer 104 may be made of a material including Si—H bonding, Si—N bonding, N—H bonding, or a combination thereof. In some embodiments, flowable layer 104 is formed by a flowable chemical vapor deposition (FCVD) process. In some embodiments, flowable layer 104 is formed by a spin-on coating process.

After flowable layer 104 is formed, flowable layer 104 is heated to form a cured layer 106a by a curing process 108, as shown in operation 12 in FIG. 1 and in FIG. 2B in accordance with some embodiments. Curing process 108 is configured to cure flowable layer 104. In addition, precursors may be used during curing process 108. In some embodiments, curing process 108 includes heating flowable layer 104 to react with precursors under a relatively high pressure, such that the precursors can react with flowable layer 104 during curing process 108.

In some embodiments, curing process 108 is performed under a pressure of over 2 atmospheres. In some embodiments, curing process 108 is performed under a pressure in a range from about 2 atmospheres to about 30 atmospheres. When the pressure applied to flowable layer 104 during curing process 108 is too low, the precursors may not be able to be fully driven into flowable layer 104, such that only the top portion of flowable layer 104 is cured but the bottom portion of flowable layer 104 is not fully cured. On the other hand, the pressure applied to flowable layer 104 during curing process 108 may not be too high, or other elements or materials formed over substrate 102 may be damaged or the hardware may reach its limit.

Since curing process 108 is performed under a relatively high pressure, the heating temperature for curing flowable layer 104 can be relatively low, such as below 700° C. In some embodiments, curing process 108 is performed at a temperature in a range from about 150° C. to about 700° C. When the heating temperature is too high, the curing process will require a high thermal budget. On the other hand, when the heating temperature is too low, flowable layer 104 may not be fully cured.

In some embodiments, the precursors include $O_2$, $H_2O$, $H_2O_2$, $O_3$, or a combination thereof. In some embodiments, precursors react with flowable layer 104 to form Si—O bonding and releasing byproduct gas such as NO, $NO_2$, or the like.

After curing process 108, cured layer 106a is formed over substrate 102 in accordance with some embodiments. In some embodiments, cured layer 106a is an insulating layer. In some embodiments, cured layer 106a is made of $SiO_2$. In some embodiments, cured layer 106a has a thickness in a range from about 1000 Å to about 10000 Å. Since cured layer 106a is formed by curing flowable layer 104 under a relatively high pressure, the temperature for heating cured layer 106a can be decreased. Therefore, the thermal budget of the curing process is decreased, and the uniformity of the resulting cured layer 106a is improved.

Figure 3:
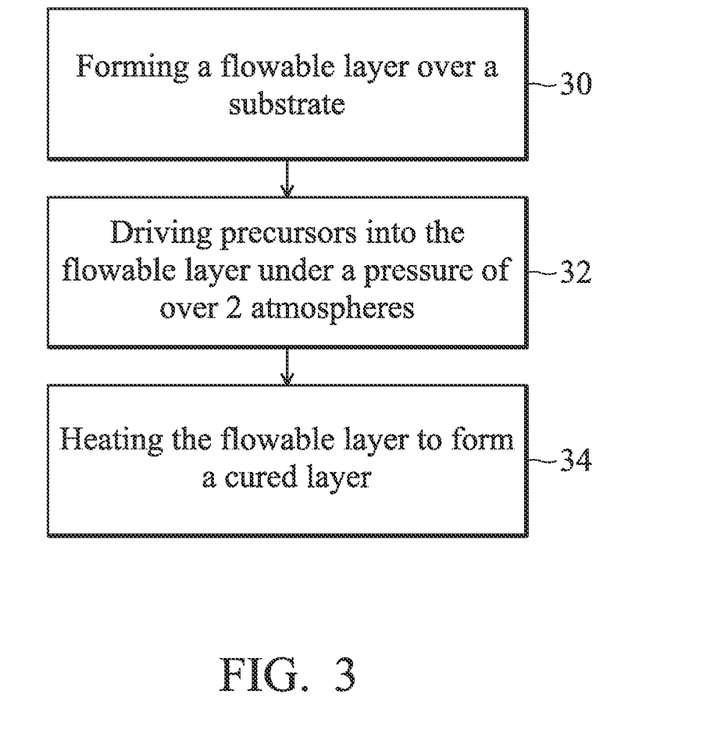
FIG. 3 is a flow chart of a method of forming a semiconductor structure in accordance with some embodiments.
Figure 4A:
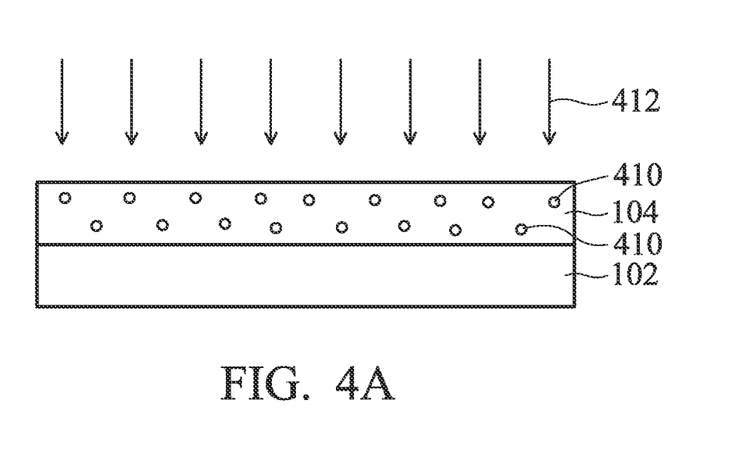
FIGS. 4A and 4B are cross-sectional representations of various stages of forming a semiconductor structure in accordance with some embodiments.
Figure 4B:
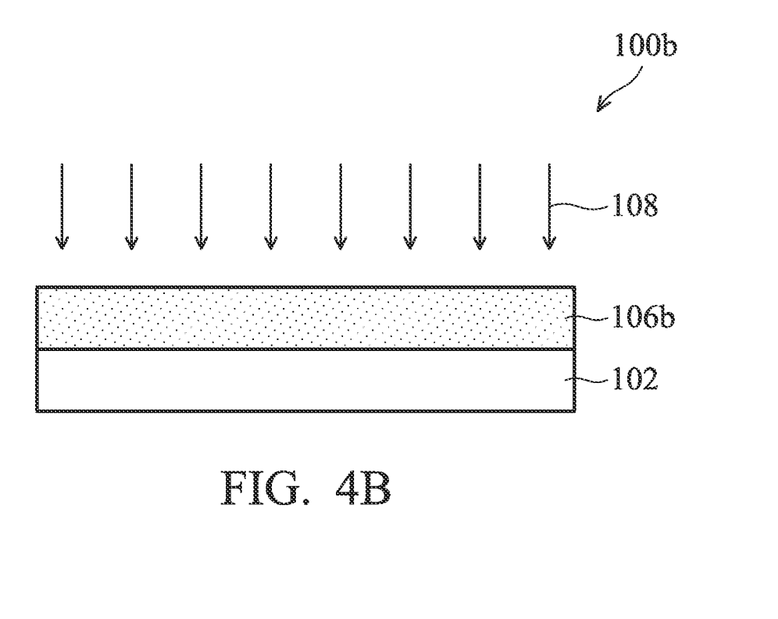

FIG. 3 is a flow chart of a method of forming a semiconductor structure in accordance with some embodiments. FIGS. 4A and 4B are cross-sectional representations of various stages of forming a semiconductor structure 100b in accordance with some embodiments. The process method shown in FIGS. 3 to 4B may be similar to that shown in FIGS. 1 to 2B, except the precursors are driven into flowable layer 104 before the curing process is performed.

As shown in FIG. 3, in operation 30, a flowable layer is formed over a substrate. In operation 32, precursors are driven into the flowable layer under a pressure of over 2 atmospheres. In operation 34, the flowable layer is heated to form a cured layer.

Similar to, or the same as, that shown in FIG. 2A, flowable layer 104 is formed over substrate 102, as shown in operation 30 in FIG. 3 in accordance with some embodiments. After flowable layer 104 is formed, precursors 410 are driven into flowable layer 104, as shown in operation 32 in FIG. 3 and in FIG. 4A in accordance with some embodiments.

In some embodiments, precursors 410 are driven into flowable layer 104 by a high-pressure process 412. In some embodiments, high-pressure process 412 includes driving precursors 410 into flowable layer 104 under a pressure of over 2 atmospheres. In some embodiments, high-pressure process 412 is performed at a pressure in a range from about 2 atmospheres to about 30 atmospheres. In some embodiments, high-pressure process 412 is performed at a pressure in a range from about 15 atmospheres to about 25 atmospheres. When the pressure applied during high-pressure process 412 is too low, the precursors may not be able to be fully driven into flowable layer 104, such that in the subsequent curing process, only the top portion of flowable layer 104 is cured but the bottom portion of flowable layer 104 is not fully cured. On the other hand, the pressure applied during high-pressure process 412 may not be too high, or other elements or materials formed over substrate 102 may be damaged or the hardware may reach its limit.

High pressure process 412 may enable precursors 410 to enter the whole of flowable layer 104, including the bottom portion of flowable layer 104, such that precursors 410 can react with the whole of flowable layer 104, including the bottom portion of flowable layer 104, during the curing process performed afterwards. In some embodiments, precursors 410 include $O_2$, $H_2O$, $H_2O_2$, $O_3$, or a combination thereof.

After high pressure process 412 is performed, flowable layer 104 is heated to form a cured layer 106b, as shown in operation 34 in FIG. 1 and in FIG. 4B in accordance with some embodiments. As shown in FIG. 4B, after precursors 410 are driven into flowable layer 104 (e.g. the bottom portion of flowable layer 104), curing process 108 is performed to heat flowable layer 104. In some embodiments, after precursors 410 are driven into flowable layer 104 by high pressure, flowable layer 104 is heated with the high pressure remains, such that precursors 410, which are driven into flowable layer 104, can react with flowable layer 104.

In addition, since precursors 410 have been driven into flowable layer 104 by high pressure process 412, flowable layer 104 can be cured under a relatively low temperature. Furthermore, as described previously, precursors 410 are driven into the whole flowable layer 104, including the bottom portion of flowable layer 104. Therefore, during curing process 108, the top portion of flowable layer 104 and the bottom portion of flowable layer 104 can react with precursors 410 at the same time. That is, the top portion of flowable layer 104 is not cured before the bottom portion of flowable layer 104 is cured. Therefore, byproduct, such as NO, $NO_2$, or some other gases, can be released from flowable layer 104 during curing process 108 and the resulting cured layer 106a can have an improved uniformity.

Figure 5:
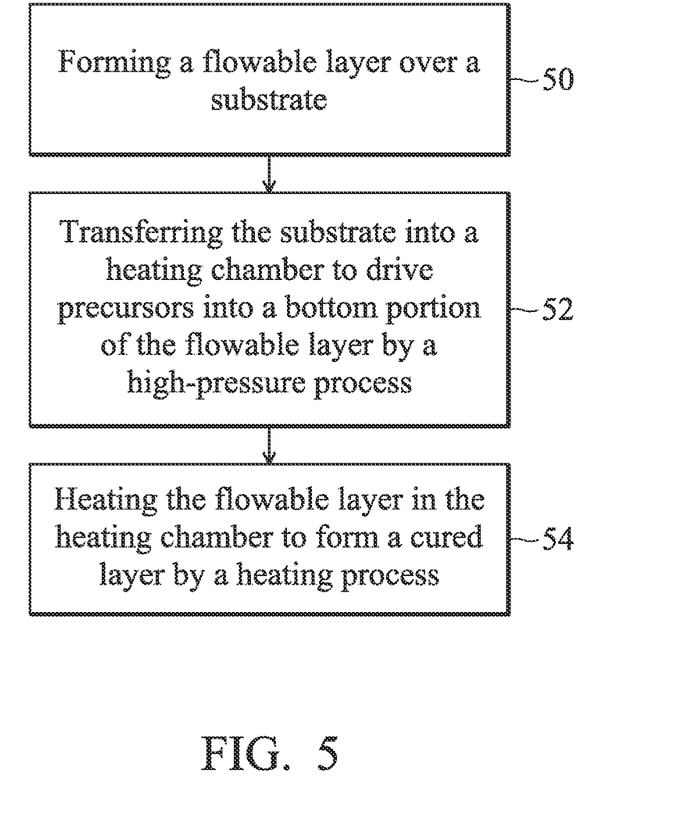
FIG. 5 is a flow chart of method of forming a semiconductor structure in accordance with some embodiments.

FIG. 5 is a flow chart of a method of forming a semiconductor structure in accordance with some embodiments. In operation 50, a flowable layer 104 is formed over a substrate. In operation 52, the substrate is transferred into a heating chamber to drive precursors into a bottom portion of the flowable layer by a high-pressure process. In operation 54, the flowable layer is heated in the heating chamber to form a cured layer by a heating process (e.g. curing process 108).

Figure 6:
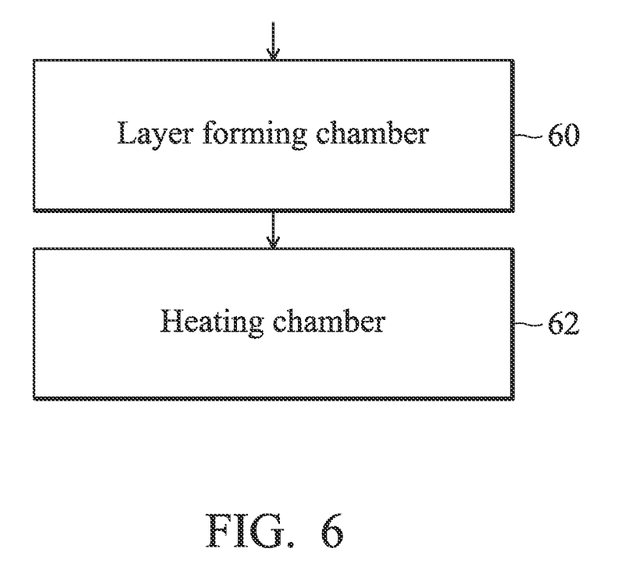
FIG. 6 a representation of a system used to form a semiconductor structure in accordance with some embodiments.

FIG. 6 a representation of a system used to form a semiconductor structure in accordance with some embodiments. The system shown in FIG. 6 may be used to perform the methods described above, such as the method shown in FIG. 5.

A substrate, such as substrate 102 described previously, is transferred to a layer forming chamber 60, as show in FIG. 6 in accordance with some embodiments. In some embodiments, layer forming chamber 60 is a flowable chemical vapor deposition (FCVD) chamber. In some embodiments, layer forming chamber 60 is configured to form a flowable layer, such as flowable layer 104 described previously, over the substrate.

After the flowable layer is formed over the substrate, the substrate is transferred to a heating chamber 62, as shown in FIG. 6 in accordance with some embodiments. In some embodiments, heating chamber 62 is an annealing chamber. In some embodiments, heating chamber 62 is configured to drive precursors, such as precursors 410 described previously, into the flowable layer and to cure the flowable layer under a pressure of over 2 atmospheres. That is, the process for driving the precursors into the flowable layer and the process for heating the flowable layer are both performed in heating chamber 62 in accordance with some embodiments.

In some embodiments, after the substrate is transferred to heating chamber 62, the precursors are applied to heating chamber under high pressure, such that the precursors are driven into the flowable layer by the high pressure. After the precursors are driven into the flowable layer by the high pressure, the temperature in heating chamber 62 is increased to heat the flowable layer with the pressure remains high, such that the precursors can react with the flowable layer and the flowable layer can be cured. In addition, since the precursors have been driven into the flowable layer by high pressure (e.g. over 2 atmospheres), the temperature for curing the flowable layer can be decreased (e.g. below 700° C.). Accordingly, the thermal budget of the curing process can be reduced.

It should be noted that the methods described in FIGS. 1 to 6 may be applied to various elements in various semiconductor structures. For example, the flowable layer described above may be used to fill in gaps or trenches in a semiconductor structure. Since the flowable layer is soft and flowable, it can be used to fill in some small gaps or small trenches. After the gaps or trenches are filled with the flowable layer, the flowable layer may be cured by the methods described in FIGS. 1 to 6, which requires a lower heating temperature and therefore has lower thermal budget. Accordingly, a cured layer or a cured structure with a relatively small size can be formed. In some embodiments, the cured layer or the cured structure has an aspect ratio greater than 7. In some embodiments, the cured layer or the cured structure is formed in a gap having a width smaller than 35 nm.

FIGS. 7A to 7E are cross-sectional representations of various stages of forming a semiconductor structure 100c in accordance with some embodiments. The method for forming semiconductor structure 100c may include using the methods described in FIGS. 1 to 6.

Figure 7A:
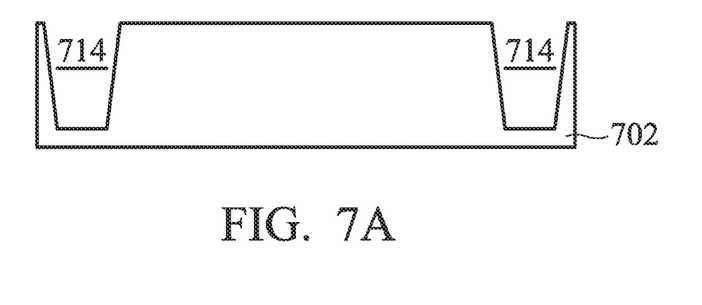
FIGS. 7A to 7E are cross-sectional representations of various stages of forming a semiconductor structure in accordance with some embodiments.

As shown in FIG. 7A, a semiconductor substrate 702 is provided in accordance with some embodiments. Semiconductor substrate 702 may be similar to, or the same as, substrate 102 described previously, and therefore the details of semiconductor substrate 702 are not repeated herein.

Trenches 714 are formed in semiconductor substrate 702, as shown in FIG. 7A in accordance with some embodiments. Trenches 714 may be formed by an etching process. In some embodiments, trenches 714 has an aspect ratio greater than 7.

Figure 7B:
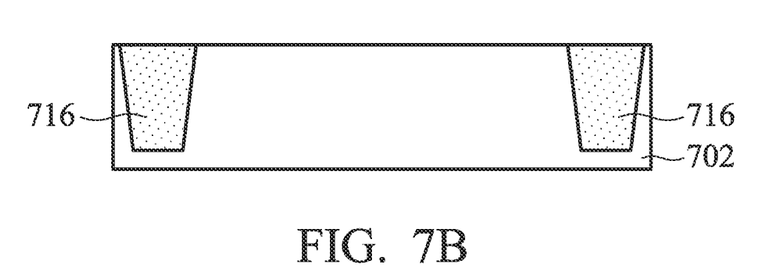

After trenches 714 are formed, shallow trench isolation (STI) structures 716 are formed in trenches 714, as shown in FIG. 7B in accordance with some embodiments. In some embodiments, trenches 714 are small and growing insulating materials therein becomes quite challenging. Therefore, in some embodiments, shallow trench isolation structures 716 are formed by forming a flowable layer to fill in trenches 714, heating the flowable layer to formed a cured layer, and polishing the cured layer to form shallow trench isolation structures 716 in trenches 714. The flowable layer may be similar to, or the same as, flowable layer 104 described previously. In some embodiments, the flowable layer is formed by a flowable chemical vapor deposition process and the flowable layer is cured by the methods described in FIGS. 1 to 6. In some embodiments, the flowable layer is first treated under a pressure over 2 atmospheres by high-pressure process 412 shown in FIG. 4A and is heated to form cured layer by curing process 108 shown in FIG. 4B. After the flowable layer is cured, the cured layer is polished by a chemical mechanical polishing (CMP) process until the top surface of semiconductor substrate 702 is exposed in accordance with some embodiments.

Figure 7C:
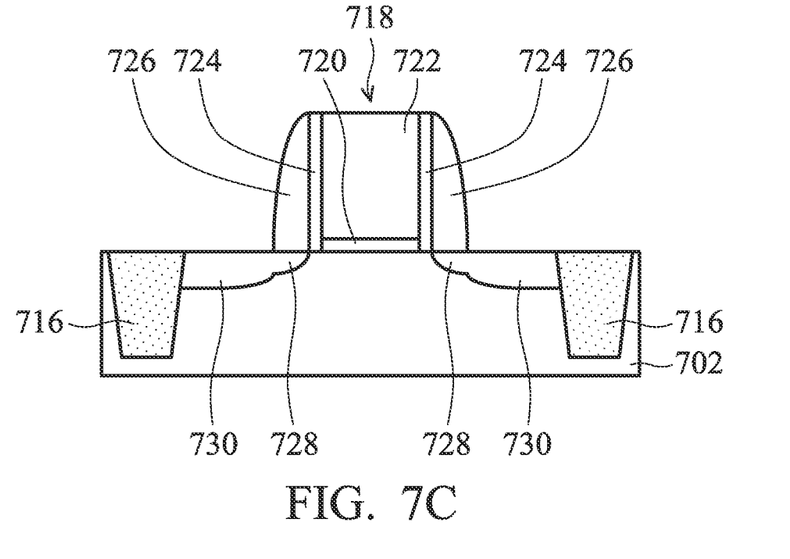

After shallow trench isolation structures 716 are formed, a dummy gate structure 718 is formed over semiconductor substrate 702, as shown in FIG. 7C in accordance with some embodiments. In some embodiments, dummy gate structure 718 include a dummy gate dielectric layer 720 and a dummy gate electrode layer 722. In some embodiments, dummy gate dielectric layer 720 is made of high-k dielectric materials, such as metal oxides, metal nitrides, metal silicates, transition metal-oxides, transition metal-nitrides, transition metal-silicates, or oxynitrides of metals. Examples of high-k dielectric material include, but are not limited to, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), silicon nitride, silicon oxynitride, zirconium oxide, titanium oxide, aluminum oxide, hafnium dioxide-alumina ($HfO_2$—$Al_2O_3$) alloy, or other applicable dielectric materials. In some embodiments, dummy gate electrode layer 722 is made of polysilicon.

Dummy gate structure 718 may be formed by a procedure including deposition, photolithography patterning, and etching processes. The deposition processes may include chemical vapor deposition (CVD), physical vapor deposition (PVD), atomic layer deposition (ALD), high density plasma CVD (HDPCVD), metal organic CVD (MOCVD), or plasma enhanced CVD (PECVD). The photolithography patterning processes may include photoresist coating (e.g., spin-on coating), soft baking, mask aligning, exposure, post-exposure baking, developing the photoresist, rinsing, drying (e.g., hard baking), and/or other applicable processes. The etching processes may include dry etching, wet etching, and/or other etching methods (e.g., reactive ion etching).

In some embodiments, a sealing layer 724 is formed on the sidewalls of dummy gate structure 718. Sealing layer 724 may protect dummy gate structure 718 from damage or loss during subsequent processing and may also prevent oxidation during subsequent processing. In some embodiments, sealing layer 724 is made of silicon nitride, silicon oxide, silicon oxynitride, silicon carbide, or other applicable dielectric materials. Sealing layer 724 may include a single layer or multiple layers.

Spacers 726 are further formed on sealing layer 724 in accordance with some embodiments. In some embodiments, spacers 726 are made of silicon nitride, silicon oxide, silicon carbide, silicon oxynitride, or other applicable materials. Spacers 726 may be formed by deposition and etching processes.

In addition, various doped regions may also be formed in semiconductor substrate 702. In some embodiments, lightly doped source/drain (LDD) regions 728 and source/drain (S/D) regions 730 are formed in semiconductor substrate 702, as shown in FIG. 7C in accordance with some embodiments. lightly doped source/drain regions 728 and source/drain regions 730 may be formed by ion implantation processes, photolithography, diffusion, and/or other applicable processes. In some embodiments, lightly doped source/drain regions 728 and source/drain regions 730 are doped with p-type dopants, such as boron or $BF_2$, and/or n-type dopants, such as phosphorus or arsenic.

Figure 7D:
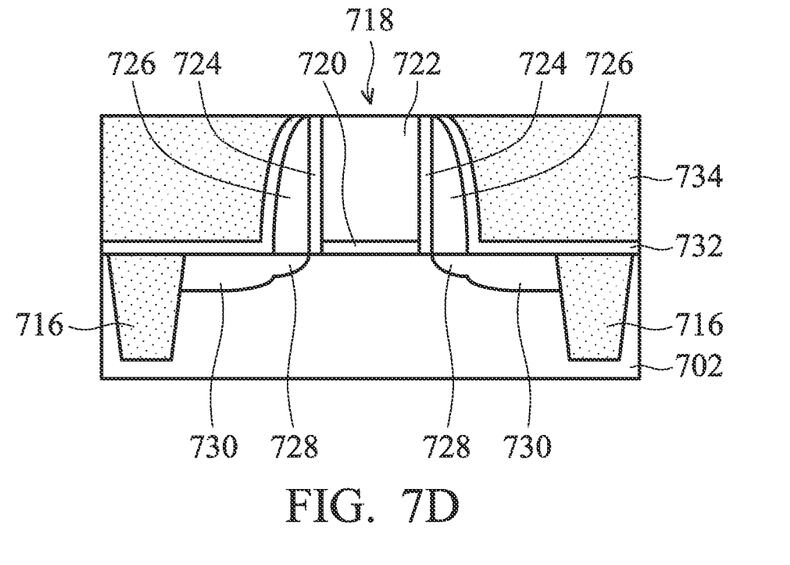

After dummy gate structure 718 is formed, a contact etch stop layer (CESL) 732 is formed to cover dummy gate structure 718 over semiconductor substrate 702, as shown in FIG. 7D in accordance with some embodiments. In some embodiments, contact etch stop layer 732 is made of silicon nitride, silicon oxynitride, and/or other applicable materials. Contact etch stop layer 732 may be formed by plasma enhanced CVD, low pressure CVD, ALD, or other applicable processes.

After contact etch stop layer 732 is formed, an inter-layer dielectric (ILD) layer 734 is formed on contact etch stop layer 732 over semiconductor substrate 702 in accordance with some embodiments. In some embodiments, inter-layer dielectric layer 734 is formed by forming a flowable layer over contact etch stop layer 732 over semiconductor substrate 702 to cover dummy gate structure 718 and heating the flowable layer to form a cured layer. In addition, the flowable layer may be formed by a flowable chemical vapor deposition process and the flowable layer may be cured by the methods described in FIGS. 1 to 6. In some embodiments, the flowable layer is first treated under a pressure over 2 atmospheres by high-pressure process 412 shown in FIG. 4A and is heated to form cured layer by curing process 108 shown in FIG. 4B afterwards.

Next, a polishing process is performed to inter-layer dielectric layer 734 and contact etch stop layer 732, as shown in FIG. 7D in accordance with some embodiments. In some embodiments, inter-layer dielectric layer 734 is planarized by a chemical mechanical polishing (CMP) process until the top surfaces of dummy gate structure 718 is exposed.

Figure 7E:
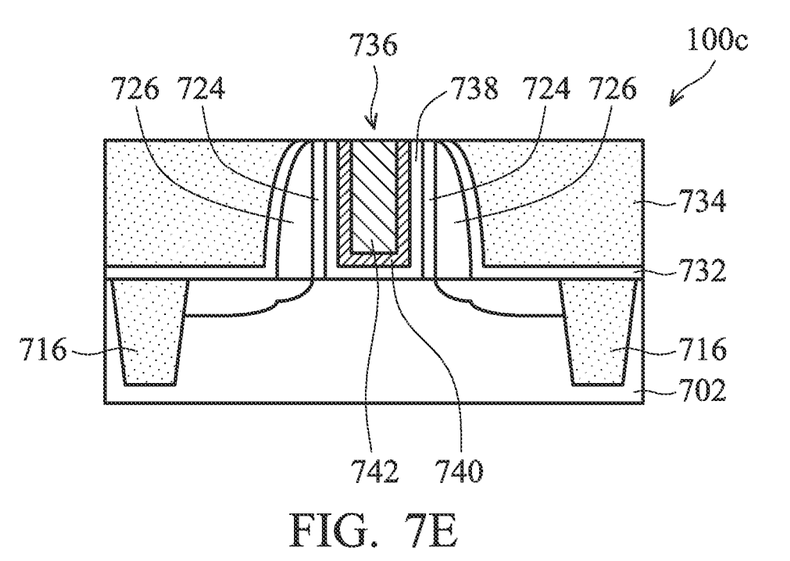

After the polishing process is performed, dummy gate structure 718 is replaced by a metal gate structure 736, as shown in FIG. 7E in accordance with some embodiments. More specifically, dummy gate structure 718 is removed to form a trench. In some embodiments, dummy gate electrode layer 722 is removed by a first etching process, and dummy gate dielectric layer 720 is removed by a second etching process after the first etching process is performed. Afterwards, metal gate structure 736 is formed in the trench in accordance with some embodiments.

In some embodiments, metal gate structure 736 includes a gate dielectric layer 738, a work function metal layer 740, and a metal gate electrode layer 742. In some embodiments, gate dielectric layer 738 is made of high k dielectric materials. Examples of the high k dielectric material may include, but are not limited to, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), metal oxides, metal nitrides, metal silicates, transition metal oxides, transition metal nitrides, transition metal silicates, oxynitrides of metals, metal aluminates, zirconium silicate, zirconium aluminate, silicon oxide, silicon nitride, silicon oxynitride, zirconium oxide, titanium oxide, aluminum oxide, or hafnium dioxide-alumina ($HfO_2$—$Al_2O_3$) alloy.

Work function metal layer 740 is formed over gate dielectric layer 738 in accordance with some embodiments. Work function metal layer 740 is customized to have the proper work function. For example, if a P-type work function metal (P-metal) for a PMOS device is desired, TiN, WN, or W may be used. On the other hand, if an N-type work function metal (N-metal) for NMOS devices is desired, TiAl, TiAlN, or TaCN, may be used.

Metal gate electrode layer 742 is formed over work function metal layer 740 in accordance with some embodiments. In some embodiments, metal gate electrode layer 740 is made of a conductive material, such as aluminum, copper, tungsten, titanium, tantulum, titanium nitride, tantalum nitride, nickel silicide, cobalt silicide, TaC, TaSiN, TaCN, TiAl, TiAlN, or other applicable materials. Gate dielectric layer 738, work function metal layer 740, and metal gate electrode layer 742 may be formed by any applicable process to any applicable thickness.

It should be noted that additional layers may be formed above and/or below gate dielectric layer 738, work function metal layer 740, and metal gate electrode layer 742, such as liner layers, interface layers, seed layers, adhesion layers, barrier layers, or the like. In addition, gate dielectric layer 738, work function metal layer 740, and metal gate electrode layer 742 may include one or more materials and/or one or more layers.

While the sizes of semiconductor devices is continuously shrinking, manufacturing elements inside the semiconductor devices is becoming more challenging. For example, it is difficult to grow a material in small gaps or trenches. Therefore, a flowable layer may be used to fill in the small gaps or trenches, and a curing process may be performed to cure the flowable layer afterwards. Accordingly, in some embodiments of the disclosure, the methods for curing flowable layer 104 are provided.

As described previously, curing process 108 is performed to cure flowable layer 104 under a relatively high pressure (e.g. over 2 atmospheres). If the high pressure is not applied to flowable layer 104, the precursors may not be driven into flowable layer 104, and therefore only the top portion of the flowable layer will react with the precursors. In addition, if only the top portion of the flowable layer is cured, the top portion may become a barrier layer, such that the precursors cannot enter into the bottom portion of the flowable layer and the byproduct formed during the curing process may be trapped in the bottom of the flowable layer. Therefore, the resulting cured layer may have poor uniformity. In addition, if the top portion of the flowable layer is cured first, a higher temperature may be required or the curing process may have to be repeated several times to cure the whole flowable layer. In this case, the thermal budget of the process may be increased.

However, in some embodiments of the disclosure, curing process 108 is performed under a relatively high pressure. Therefore, the precursors can be driven into flowable layer 104. In addition, in some embodiments, high-pressure process 412 is performed to drive precursors 410 into flowable layer 104 before curing process 108 is performed. That is, precursors 410 can enter into flowable layer 104 while it is still soft and easy to penetrate.

After precursors 410 are driven into the whole flowable layer 104, including the bottom portion of flowable layer 104, flowable layer 104 is heated to a relatively low temperature, such as below 700° C., for curing flowable layer 104. Since precursors 410 are driven into the whole flowable layer 104 beforehand, the whole flowable layer 104 can be cured at the same time during curing process 108. In addition, the top portion of flowable layer 104 will not become the barrier layer for its bottom portion. Therefore, byproduct such as NO or $NO_2$ can be released from flowable layer 104, and the uniformity of the resulting cured layer 106b can be improved.

Furthermore, since the top portion and the bottom portion of flowable layer 104 can be cured at the same time in the same procedure, curing processes do not have to be repeated, and a lower temperature is required. Therefore, the thermal budget of the process is reduced.

Embodiments of methods for forming a semiconductor structure are provided. A flowable layer is formed over a substrate. The flowable layer is heated under a relatively high temperature, such as over 2 atmospheres, by a curing process. By applying the high temperature during the curing process, precursors are driven into the flowable layer, and therefore the temperature for curing the flowable layer can be reduced. Accordingly, the thermal budget for forming the semiconductor structure is reduced.

In some embodiments, a method for forming a semiconductor structure is provided. The method for forming a semiconductor structure includes forming a flowable layer over a substrate and heating the flowable layer to form a cured layer in a curing process. In addition, the curing process is performed under a pressure of over 2 atmospheres, and the flowable layer reacts with precursors in the flowable layer during the curing process.

In some embodiments, a method for forming a semiconductor structure is provided. The method for forming a semiconductor structure includes forming a flowable layer over a substrate and driving precursors into the flowable layer under a pressure of over 2 atmospheres. The method for forming a semiconductor structure further includes heating the flowable layer to form a cured layer by a curing process. In addition, the curing process is performed under a pressure of over 2 atmospheres, and the flowable layer reacts with the precursors in the flowable layer during the curing process.

In some embodiments, a method for forming a semiconductor structure is provided. The method for forming a semiconductor structure includes forming a flowable layer over a substrate and transferring the substrate into a heating chamber, wherein precursors are driven into the flowable layer by a high-pressure process. The method for forming a semiconductor structure includes heating the flowable layer in the heating chamber to form a cured layer by a curing process. In addition, the high-pressure process is performed at a pressure of over 2 atmospheres.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
    forming a flowable layer over a substrate;
    driving precursors into the flowable layer before a curing process under a pressure of over 2 atmospheres, wherein the flowable layer has a top portion and a bottom portion and the bottom portion is disposed between the top portion and the substrate such that the precursors enter and react with the top portion and with the bottom portion, wherein the precursors comprise $O_2$, $H_2O$, $H_2O_2$, $O_3$ or a combination thereof; and
    heating the flowable layer to form a cured layer in the curing process, wherein the curing process is performed under a pressure of over 2 atmospheres, the flowable layer reacts with the precursors in the flowable layer during the curing process, and after the cured layer is formed, no heating process is performed to the cured layer.

2. The method for forming a semiconductor structure as claimed in claim 1, wherein the flowable layer is formed by a flowable chemical vapor deposition (FCVD) process.

3. The method for forming a semiconductor structure as claimed in claim 1, wherein the flowable layer is formed by a spin-on coating process.

4. The method for forming a semiconductor structure as claimed in claim 1, wherein the cured layer is made of $SiO_2$.

5. The method for forming a semiconductor structure as claimed in claim 1, wherein the flowable layer is heated under a pressure in a range from about 2 atmospheres to about 30 atmospheres during the curing process.

6. The method for forming a semiconductor structure as claimed in claim 1, wherein the flowable layer is heated to a temperature in a range from about 150° C. to about 700° C. during the curing process.

7. The method for forming a semiconductor structure as claimed in claim 1, wherein the precursors are driven into the flowable layer under a pressure in a range from about 2 atmospheres to about 30 atmospheres.

8. A method for forming a semiconductor structure, comprising:
    forming a flowable layer over a substrate, wherein the flowable layer has a top portion and a bottom portion and the bottom portion is disposed between the top portion and the substrate;
    driving precursors into the flowable layer under a pressure of over 2 atmospheres such that the precursors enter and react with the top portion and with the bottom portion of the flowable layer, wherein the precursors comprise $O_2$, $H_2O$, $H_2O_2$, $O_3$, or a combination thereof; and
    heating the flowable layer to form a cured layer in a curing process,
    wherein the curing process is performed under a pressure of over 2 atmospheres, the flowable layer reacts with the precursors in the flowable layer during the curing process, and after the cured layer is formed, no heating process is performed to the cured layer.

9. The method for forming a semiconductor structure as claimed in claim 8, wherein the flowable layer is formed by a flowable chemical vapor deposition (FCVD) process or a spin-on coating process.

10. The method for forming a semiconductor structure as claimed in claim 8, wherein the cured layer is made of $SiO_2$.

11. The method for forming a semiconductor structure as claimed in claim 8, wherein the precursors are driven into the flowable layer under a pressure in a range from about 2 atmospheres to about 30 atmospheres.

12. The method for forming a semiconductor structure as claimed in claim 8, wherein the flowable layer is heated after the precursors are driven to the bottom portion of the flowable layer.

13. The method for forming a semiconductor structure as claimed in claim 8, further comprising:
    releasing gas from the flowable layer when the flowable layer is heated.

14. The method for forming a semiconductor structure as claimed in claim 13, wherein the gas comprises NO, $NO_2$, or a combination thereof.

15. A method for forming a semiconductor structure, comprising:

forming a flowable layer over a substrate, wherein the flowable layer has a top portion and a bottom portion and the bottom portion is disposed between the top portion and the substrate;

transferring the substrate into a heating chamber, wherein precursors are driven into the top portion and the bottom portion of the flowable layer by a high-pressure process, and the precursors comprise $O_2$, $H_2O$, $H_2O_2$, $O_3$ or a combination thereof; and heating the flowable layer in the heating chamber to form a cured layer by a curing process, wherein the high-pressure process is performed at a pressure of over 2 atmospheres, and after the cured layer is formed, no heating process is performed to the cured layer.

16. The method for forming a semiconductor structure as claimed in claim 15, wherein the high-pressure process is performed at a pressure in a range from about 2 atmospheres to about 30 atmospheres.

17. The method for forming a semiconductor structure as claimed in claim 15, wherein the curing process is performed after the precursors are driven into bottom portion of the flowable layer, and the curing process comprises heating the flowable layer to a temperature in a range from about 150° C. to about 700° C. under a pressure in a range from about 2 atmospheres to about 30 atmospheres.

18. The method for forming a semiconductor structure as claimed in claim 15, wherein the precursors react with the flowable layer to form Si—O bonding during the curing process.

* * * * *